United States Patent

[11] 3,582,824

[72] Inventor Cecil C. Lencioni, Jr.
Chicago, Ill.

[21] Appl. No. 795,600
[22] Filed Jan. 31, 1969
[45] Patented June 1, 1971
[73] Assignee Beckamn Instruments, Inc.

[54] AUDIO OSCILLATOR
14 Claims, 2 Drawing Figs.

[52] U.S. Cl. .......... 331/109, 331/117, 331/183
[51] Int. Cl. .......... H03b 3/02
[50] Field of Search .......... 331/109, 117, 183

[56] References Cited

UNITED STATES PATENTS 2,451,021 10/1948 Detuno .......... 331/183

FOREIGN PATENTS 1,090,158 11/1967 Great Britain .......... 331/109

*Primary Examiner*—John Kominski
*Attorneys*—Richard M. Jennings and Robert J. Steinmeyer

ABSTRACT: A temperature compensated, direct current feedback loop stabilizes the output level of an audio oscillator and gives the oscillator a negative effective output impedance, so that the oscillator can maintain a low distortion, constant level sine wave across the terminals of a remotely located load.

Figure 1:
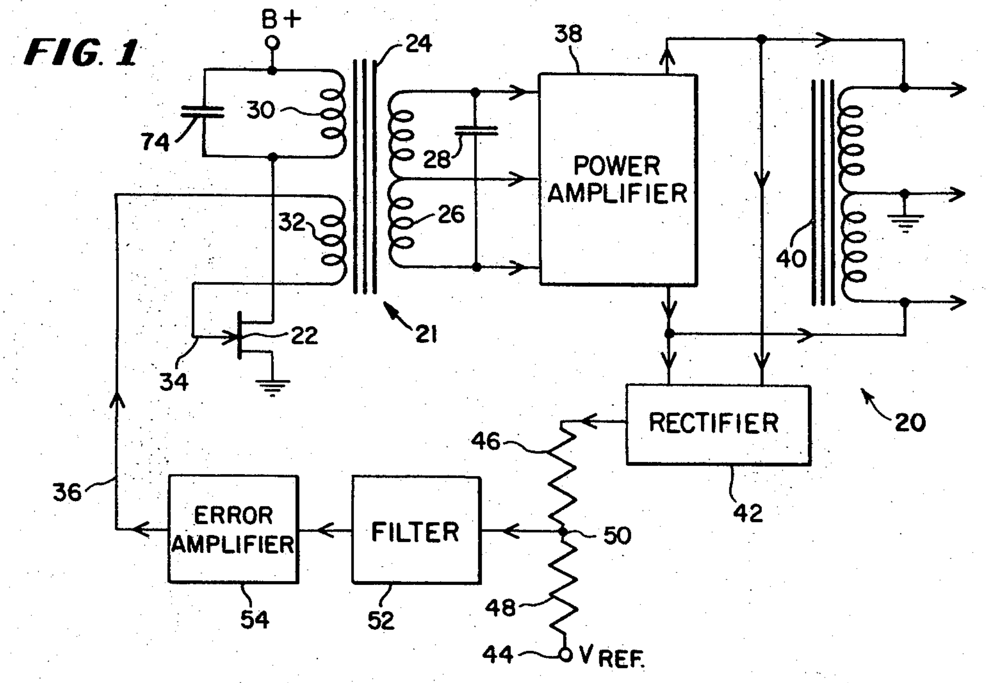

INVENTOR:
CECIL C. LENCIONI Jr.
By Robert J. Steinmeyer
Attorney

AUDIO OSCILLATOR

The present invention relates to stabilized feedback oscillators, and more particularly to temperature and load stabilized audio oscillators that are simple in their design.

Many different forms of audio oscillator circuits have been used in the past, having varying degrees of stability, varying levels of signal distortion, and varying output characteristics. Among the simpler circuits, the most stable usually rely upon nonlinearities in an oscillator tank circuit to limit signal amplitude. Such circuits are quite stable, but they introduce large amounts of distortion into the generated signal. The most distortion free of the simple circuits usually include a light bulb or some similar temperature sensitive resistor in an oscillator tank circuit feedback network. Such circuits generate pure sine waves, but often are not able to maintain a constant level output signal when confronted with variations in load or in temperature.

It is often desirable to provide an audio oscillator with a negative output impedance that can cancel out the effects of resistive losses in a transmission line leading to a remotely located load. Conventionally this is done by adding a regenerative audio feedback loop to an audio oscillator output amplifier. This audio loop increases the amplifier output voltage in response to an increase in output current by adding to the output voltage an extra component that is proportional to the output current. Such regenerative feedback loops add significantly to the cost of an audio oscillator, and are only rarely incorporated into low cost oscillator circuits.

A primary object of the present invention is therefore the production of a simple audio oscillator circuit that can maintain a constant amplitude signal output across a remotely located load even when subjected to changes in loading and changes in operating temperatures, and that is able to generate an extremely pure, distortionless sine wave.

A further object of the present invention is the production of an audio oscillator that has a negative output impedance, yet that does not require the use of a regenerative audio feedback loop.

In accordance with these and many other objects, an embodiment of the present invention comprises an audio oscillator capable of generating an output signal that is free from distortion and stable in the face of variations in temperature and loading, and that has a negative effective output impedance. This oscillator is able to supply a sine wave of constant amplitude to a remotely located load through a relatively lossy transmission line. A single, direct current feedback loop both stabilizes the oscillator signal output level, and also gives the oscillator a negative effective output impedance so that the oscillator output signal level increases in response to an increase in the current drawn by the load. This feedback loop includes a feedback rectifier, a reference voltage comparison circuit, and an error amplifier all connected in series. The input signal fed to the rectifier comes from the primary of an oscillator output transformer, and the output of the error amplifier is fed to the gate of a field effect transistor in the oscillator tank circuit. This feedback loop varies the gain of the field effect transistor to control the oscillator output signal level. Any change in the oscillator output signal level causes a change in the rectifier feedback signal level. Such changes are detected and amplified by the error amplifier, and are used to either decrease or increase the gain of the field effect transistor amplifier and thus to bring the oscillator output signal level back to the desired magnitude. By balancing the temperature coefficient of the feedback rectifier against that of the input to the error amplifier, the operation of this feedback loop is made insensitive to changes in temperature.

The negative output impedance is provided not by audio feedback, as in prior art arrangements, but by direct current feedback. A direct current voltage proportional to the oscillator audio output current is subtracted from the rectified feedback signal. This causes the feedback network to increase the amplitude of the signal generated by the oscillator. The direct current voltage is conveniently generated across the resistance of the output transformer primary by current flow from the oscillator power amplifier. The power amplifier is a class B amplifier, so the direct current flow through the output transformer primary is proportional to the audio output current. This direct current flow reverse biases the feedback rectifier and thus effectively subtracts a direct current voltage from the rectified feedback signal.

Figure 2:
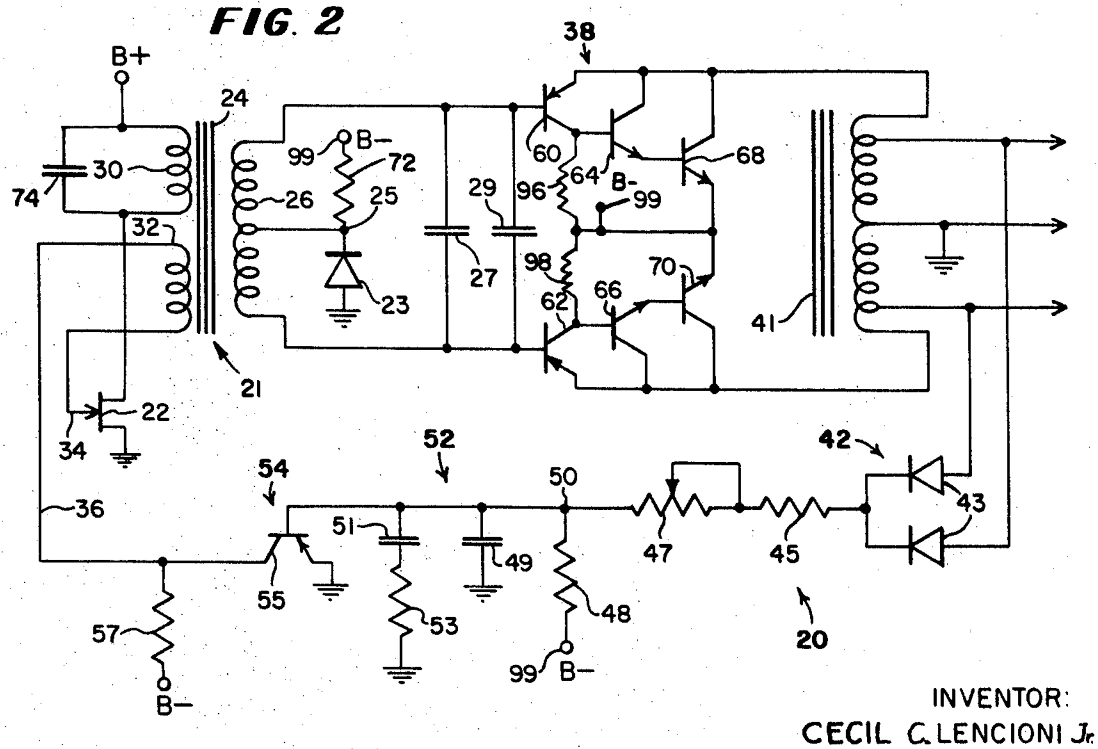

The invention, together with other objects and advantages thereof, will best be understood from considering the following detailed description in conjunction with the drawings in which:

FIG. 1 is a block diagram of an audio oscillator designed in accordance with the present invention; and FIG. 2 is a complete schematic diagram of an audio oscillator designed in accordance with the present invention.

Referring now to FIG. 1 of the drawings, a stabilized audio oscillator characterized by features of the invention is designated generally as 20. The oscillator 20 includes basically a tank circuit 21, a power amplifier 38, an output autotransformer 40, and a direct current feedback network including elements 42 through 54. The tank circuit 21 includes a transformer 24 having a tuned primary winding 30, a tuned secondary winding 26, and an untuned secondary winding 32. A field effect transistor 22 amplifies the signal presented by the untuned secondary winding 32 and impresses the amplified signal upon the tuned primary winding 30 to produce oscillations. The gate 34 of the transistor 22 is connected to a gain control line 36 through the winding 32. The potential of this gain control line determines the operating point, and thus the gain of the field effect transistor 22, and thereby controls the stability of oscillations within the tank circuit 21. A positive signal on the gain control line 36 causes the oscillations to increase in amplitude, while a negative signal causes the oscillations to decrease in amplitude. Normally, the potential of the line 36 is such as maintains oscillations of constant amplitude within the tank circuit 21. The frequency at which oscillations occur is determined by the tuning of the tuned windings 26 and 30 of the transformer 24. The oscillations developed within the tank circuit 21 are amplified by the power amplifier 38, which is a class B unity gain power amplifier, and are applied to the output autotransformer 40. A suitable load is then connected across the transformer 40.

The direct current feedback network measures the amplitude of the output signal developed across the autotransformer 40, and varies the potential applied to the gain control line 36 as needed to maintain the output signal at a predetermined desired level. A rectifier 42 rectifies the signal developed across the autotransformer 40 and develops a direct current feedback signal that is proportional to the amplitude of the audio signal. This direct current feedback signal is compared to a reference potential $V_{REF}$44 by a simple weighted comparison or subtraction circuit. The comparison circuit comprises two resistors 46 and 48 serially connected between the two potentials or signals which are to be compared. An error signal is developed at a node 50 formed by the junction of the resistors 46 and 48. This error signal differs from ground by an amount proportional to the difference between the reference potential $V_{REF}$ multiplied by the resistance ratio of resistor 46 to resistor 48 and the direct current feedback signal. The resistors 46 and 48 are chosen to make this error signal a measure of the amount by which the audio oscillator 20 output signal level deviates from the proper value. The error signal is amplified by an error amplifier 54 and is applied directly to the gain control line 36 to regulate the stability of the tank circuit 21. A filter 52 eliminates ripple from the error signal before the signal enters the error amplifier 54. The amplitude of the audio output signal developed across the output autotransformer 40 is determined by the magnitude of the reference potential $V_{REF}$44, by the values of the two resistors 46 and 48, and by the nature of the rectifier 42. If the rectifier 42 is of the full wave averaging type, as shown in FIG. 2, the audio output level is approximately:

$$V_{RMS}=\frac{\sqrt{2}\pi R_{46}}{4R_{48}}V_{REF}$$

The audio output level is not affected by changes in tolerance of any elements other than $R_{46}$ and $R_{48}$ and hence remains stable even when the oscillator 20 is subjected to changing environmental and load conditions. Good temperature stability is achieved by balancing the temperature drift of the rectifier 42 against that of the error amplifier 54, as will be explained. Temperature drift elsewhere in the oscillator 20 is nullified by feedback, except as noted and explained below.

Assume that the oscillator 20 is operating and generating a signal which appears across the autotransformer 40. Assume further that a load is applied to the terminals of the autotransformer 40 and causes the signal level across the transformer 40 to drop. This drop in signal level causes an immediate drop in the direct current feedback signal generated by the rectifier 42. This drop in signal level appears at the node 50 and causes the error amplifier 54 to drive the gain control line 36 in a positive direction. This biases the gate 34 of the field effect transistor 22 positively and increases the gain of the field effect transistor 22. The field effect transistor 22 then pumps more energy into the oscillator tank circuit 21, and causes the audio signal across the tuned secondary winding 26 to grow in amplitude. This growing signal is amplified by the power amplifier 38 and is applied directly to the output autotransformer 40. As the output signal across the transformer 40 grows, the direct current feedback signal developed by the rectifier 42 also grows and biases the node 50 positively, thus reducing the amplitude of the error signal. When the voltage across the autotransformer 40 returns to its original value, the potential at the node 50 returns approximately to ground, and the output of the error amplifier 54 returns to the level at which there is no growth or decay in the audio oscillator output signal level. In this manner, the direct current feedback loop maintains the output of the oscillator 20 at any desired level.

The power amplifier 38 has a very low output impedance, so it takes considerable loading of the autotransformer 40 to produce any significant change in the audio signal output level, even without feedback. Any change that does occur is compensated for by feedback as explained above. The oscillator 20 thus has an extremely low output impedance, and is very stable in face of widely varying load conditions.

An effective negative output impedance is provided by the fact that the direct current drawn by the class B power amplifier 38 increases when the current drawn by the external load increases. This power amplifier current produces an IR voltage drop across the autotransformer 40, due to the finite resistance of the transformer winding. When such a voltage drop arises in response to an increase in load current, it is passed directly through the feedback rectifier 42 and appears as an error signal at the node 50. In response to this error signal, the error amplifier 54 increases the gain of the field effect transistor 22 and allows the oscillator audio output level to rise until the error signal disappears. The audio oscillator 20 thus responds to an increase in load current by boosting the audio signal level slightly, as though the oscillator output terminals were connected in series with a negative resistor. The effective negative output resistance of the oscillator is the ratio of the audio voltage increase to the load current increase. This negative resistance can be adjusted so as to equal the positive resistance of a transmission line coupling the audio oscillator 20 to a remotely located load. The two resistance than cancel one another, and a constant audio voltage is maintained across the load in spite of load variations. The negative output resistance of the oscillator 20 can be adjusted by changing the gauge of wire within the autotransformer 40, by the use of taps on the transformer 40, or by any other convenient means.

Referring now to FIG. 2, there is shown a detailed schematic diagram of the stabilized audio oscillator 20. The amplifier 38 is shown in FIG. 2 to be a unity gain push-pull class B audio amplifier. Error transistors 60 and 62 detect differences between the potential across the tuned secondary winding 26 of the transformer 24 and the potential across an output autotransformer 41. Any error results in a current that is amplified by current amplifying transistors 64 and 66 and that is further amplified and inverted by transistors 68 and 70. The transistors 68 and 70 supply current to the autotransformer 41 on alternate half cycles to correct the error signals detected by the error transistors 60 and 62. The center tap 25 of the secondary winding 26 is biased negatively so that operation of the power amplifier 38 is not quite true class B, but includes a small amount of overlap or crossover between the operation of the two sides of the amplifier. In this manner, crossover distortion is minimized. A diode 23 acts as a temperature stabilizing device and compensates for temperature changes in the emitter-base junctions of the error transistors 60 and 62. This diode prevents drift of the quiescent DC output current which flows through the output autotransformer 41. Drift in this quiescent current can develop a potential across the autotransformer 41 and alter the biasing of the rectifier diodes 43, thus causing a change in the audio oscillator signal output level.

The rectifier 42 comprises the two diodes 43 which function as a full wave averaging type rectifier. In FIG. 2, the resistor 46 is replaced by a resistor 45 and a variable resistor 47 is connected in series with one another. The variable resistor 47 is adjusted to set the signal output level of the audio oscillator 20. The filter 52 comprises a first capacitor 49, and a series circuit including a second capacitor 51 and a resistor 53. The values of these components are chosen to suppress the second harmonic ripple present in the output of the rectifier 42, and to obtain the best possible feedback transient response. The error amplifier 54 comprises a transistor 55 and a resistor 57 connected as grounded emitter transistor amplifier. The output signal from the error amplifier 54 appears at the junction point between the resistor 57 and the collector of the transistor 55. This signal is applied to the gain control line 36 and controls the gain of the field effect transistor 22 as explained above. The input impedance of the field effect transistor 22 gate electrode 34 is so high that the loading upon the output of the error amplifier 54 is negligible.

A tuning capacitor 28 (FIG. 1) is replaced by a capacitor 27, and by a small frequency adjusting capacitor 29. The autotransformer 40 in FIG. 1 is replaced in FIG. 2 by the autotransformer 41 having additional taps as shown. These taps allow a higher level of signal to be maintained at the output of the power amplifier 38 than is applied to the load, thus further minimizing crossover distortion while lowering the output signal and impedance level.

Temperature stability of the feedback network is provided by matching the temperature coefficients of the two diodes 43 against the temperature coefficient of the emitter-base junction of the transistor 55. When the temperature rises, the increased potential necessary to produce conduction in diodes 43 causes the node 50 to go slightly negative. This change in the potential at the node 50 is balanced by the increased negative potential required to maintain the same level of conduction in the transistor 55. Temperature stability is obtained to the degree that the temperature-voltage coefficient $(dv/dt)(T)$ of the diodes 43 matches the temperature-voltage coefficient $(dv/dt)(T)$ of the emitter-base junction of the transistor 55 multiplied by $$\frac{R_{45}+R_{47}+R_{48}}{R_{48}}.$$

The negative output impedance is provided by the direct current which flows from the transistors 68 and 70 through the windings of the autotransformer 41, as explained above. This direct current causes a slight IR potential drop in the winding of the autotransformer 41, and thus causes the signals presented to the diodes 43 to be slightly more negative in potential than would be the case if the diodes 43 were connected to a secondary winding. The diodes 43 pass this small negative potential to the feedback network, and a small increase in the audio output signal level results. When an increased load is connected across the output autotransformer 41, there is an increase in the direct current which flows out of the transistors 68 and 70 during each half audio cycle, due to the class B nature of the power amplifier 38. This increase in direct current produces a greater IR drop across the winding of the autotransformer 41 and subtracts from the potential applied to the diodes 43, thus reducing the amplitude of the DC feedback signal. The audio oscillator 20 responds by increasing the level of the audio output signal, as explained above. Thus, as the oscillator load is increased, the audio output signal level appearing across the transformer 41 also increases proportionately The net result of all this is that the stabilized oscillator 20 is given a negative effective output impedance with a response time determined by the filter 52. Since proportionately. phenomena is entirely dependent upon direct currents and resistances, the resulting regenerative feedback arrangement is quite stable and is not prone to audio instabilities. Ideally, the negative resistance is adjusted so as to increase the audio output signal level just enough so that a constant audio output is maintained across a remotely located load, to compensate for the resistance loss in the connecting transmission line. With this circuit it is possible to maintain a stable audio signal across a remotely located load without the necessity of running a voltage sensing line from the load back to the oscillator 20.

In FIG. 2, the B minus supply 99 serves as a reference potential in place of the reference potential $V_o$ 44 shown in FIG. 1. This can be only done if the B minus supply 99 is well enough regulated to serve as a stable reference. Alternatively, a conventional zener diode reference potential can be used.

While the circuit parameters and types of transistors used in the described system may be chosen to meet the requirements of any particular installation, the following circuit specifications have been found satisfactory for use in the construction of a 400 HZ audio oscillator powered by a power supply having +15V, −15V, and GROUND power terminals:

| | Name | Description |
|---|---|---|
| Element Number: | | |
| 22 | Field effect transistor | MPF 104. |
| 23 | Diode | 1N 914. |
| 27 | Capacitor | 0.33 microfarads. |
| 29 | do | Do. |
| 43 | Diodes | 1N 914. |
| 45 | Resistor | 10,000 ohms. |
| 47 | Variable resistor | 2,000 ohms. |
| 48 | Resistor | 50K ohms. |
| 49 | Capacitor | 250 microfarads. |
| 51 | do | Do. |
| 53 | Resistor | 47 ohms. |
| 55 | Transistor | MPS 6518. |
| 57 | Resistor | 10,000 ohms. |
| 60 | Transistor | MPS 6518. |
| 62 | do | MPS 6518. |
| 64 | do | 2N 697. |
| 66 | do | 2N 697. |
| 68 | do | RCA 40250. |
| 70 | do | RCA 40250. |
| 72 | Resistor | 47,000 ohms. |
| 74 | Capacitor | 0.022 microfarads. |
| 96 | Resistor | 47,000 ohms. |
| 98 | do | Do. |

Although the present invention has been described with reference to an illustrative embodiment thereof, it should be understood that numerous other modifications and changes will readily occur to those skilled in the art, and it is therefore intended by the appended claims to cover all such modifications and changes as will fall within the true spirit and scope of the invention.

What I claim as new and desired to be secured by Letters Patent of the United States is:

1. An oscillator comprising:

tank circuit having a gain control line input and having a signal output;

a class B power amplifier including a transformer, having an input connected to the signal output of said tank circuit, and having a signal output that is developed across a primary winding of the transformer; and a direct current feedback network having a rectifier input connected to the primary winding of said transformer and having a gain control output connecting to said gain control line input of said tank circuit.

2. An oscillator in accordance with claim 1 wherein the tank circuit includes a field effect transistor amplifier having a gate input and wherein the gain control line input supplies bias to the gate input of the field effect transistor amplifier.

3. An oscillator comprising:

a tank circuit including a field effect transistor amplifier having a signal output, and also having a gain control line input supplying bias to the field effect transistor amplifier;

a class B power amplifier including an output transformer, having a signal input connected to the signal output of said tank circuit, and providing an AC output signal to the primary winding of the transformer;

said power amplifier providing a DC current output signal whose magnitude is a function of the current drawn by the oscillator load;

means for connecting said DC current output signal to at least a portion of said primary winding of said transformer to develop a DC voltage drop across said portion of said primary winding;

a rectifier having an input connected to the primary winding of said transformer and having a direct current feedback output, said DC voltage drop appearing across the primary winding of the transformer being applied to said rectifier to reverse bias said rectifier as a function of the magnitude of said DC voltage drop;

a reference potential;

a weighted subtraction circuit connecting said direct current feedback output to said reference potential, and having an error signal output; and an error amplifier having an input connected to said error signal output and having an output connected said gain control line.

4. An oscillator circuit comprising:

a tank circuit for providing AC signal oscillations at a selected frequency;

gain control means connected to said tank circuit for regulating the magnitude of the AC signal oscillations;

a class-B power amplifier coupled to said tank circuit for amplifying said AC signal;

a DC power supply for providing an appropriate bias to said power amplifier;

a transformer connected to the output of said power amplifier;

tap means for connecting one point of the primary winding of said transformer to a circuit common reference point whereby said DC power supply, said power amplifier, a portion of said transformer primary winding and said tap means defines a direct current signal path through which a DC current flows to develop a DC voltage across said portion of said transformer primary winding;

a rectifier for rectifying said AC signal and providing a direct current output signal;

means for simultaneously coupling both said AC signal and said DC voltage to said rectifier, said DC voltage applying a reverse bias to said rectifier;

a reference potential;

a weighted subtraction network connected to said rectifier output and said reference potential for generating an error signal whose magnitude is proportional to the difference between the reference potential and the amplitude of the direct current output signal provided by said rectifier; and means for applying said error signal to said gain control means to vary the magnitude of said AC signal oscillations until the error signal reaches a predetermined value.

5. An oscillator circuit as claimed in claim 4 wherein said transformer comprises an autotransformer.

6. An oscillator circuit as claimed in claim 5 wherein the ratio of the number of turns in the primary winding to the number of turns in the secondary winding of the transformer is 1:1.

7. An oscillator circuit as claimed in claim 5 wherein said means for applying said error signal includes an error amplifier comprising a single transistor.

8. An oscillator circuit as claimed in claim 6 wherein said rectifier comprises a pair of like-poled diodes connected in parallel with each other.

9. An oscillator circuit as claimed in claim 7 wherein the temperature coefficient of said like-poled diode pair are matched against the temperature coefficient of the emitter base junction of said single transistor and error amplifier to provide stability against temperature variations.

10. An oscillator circuit as claimed in claim 7 wherein said gain control means comprises a field effect transistor having a gate control electrode and wherein said error signal is impressed upon said gate control electrode.

11. An oscillator circuit as claimed in claim 4 wherein the class B power amplifier includes temperature compensating means to prevent drift of the quiescent DC output current which flows in the primary winding of the transformer.

12. An oscillator circuit as claimed in claim 4 wherein said circuit common reference point is circuit ground.

13. An oscillator circuit as claimed in claim 8 comprising in addition a filter connected between said weighted subtraction network and said error amplifier.

14. An oscillator circuit as claimed in claim 4 wherein said weighted subtraction network comprises a plurality of resistors serially connected between said reference potential and said rectifier.